(12) United States Patent
Di Cioccio

(10) Patent No.: US 11,121,117 B2
(45) Date of Patent: Sep. 14, 2021

(54) METHOD FOR SELF-ASSEMBLING MICROELECTRONIC COMPONENTS

(71) Applicant: COMMISSARIAT A L'ENERGIE ATOMIQUE ET AUX ENERGIES ALTERNATIVES, Paris (FR)

(72) Inventor: Lea Di Cioccio, Saint Ismier (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/491,428

(22) PCT Filed: Mar. 7, 2018

(86) PCT No.: PCT/EP2018/055687
§ 371 (c)(1),
(2) Date: Sep. 5, 2019

(87) PCT Pub. No.: WO2018/162605
PCT Pub. Date: Sep. 13, 2018

(65) Prior Publication Data
US 2020/0020665 A1  Jan. 16, 2020

(30) Foreign Application Priority Data

Mar. 8, 2017 (FR) ...................... 1751901

(51) Int. Cl.
*H01L 23/00* (2006.01)
*H01L 21/68* (2006.01)
*H01L 25/065* (2006.01)

(52) U.S. Cl.
CPC .............. *H01L 24/94* (2013.01); *H01L 21/68* (2013.01); *H01L 24/80* (2013.01); *H01L 25/0652* (2013.01); *H01L 2224/80136* (2013.01)

(58) Field of Classification Search
CPC ......... H01L 24/94; H01L 21/68; H01L 24/80; H01L 25/0652; H01L 2224/80136;
(Continued)

(56) References Cited

U.S. PATENT DOCUMENTS 6,507,989 B1 *   1/2003   Bowden ................ 257/E21.705
7,794,799 B1 *   9/2010   Kim ........................ B82Y 30/00
                                                           427/532
(Continued)

FOREIGN PATENT DOCUMENTS

FR    2 988 517 A1    9/2013
FR    3 039 700 A1    2/2017
(Continued)

OTHER PUBLICATIONS

U. Srinivasan, D. Liepmann and R. T. Howe, "Microstructure to substrate self-assembly using capillary forces", IEEE JMEMS vol. 10, p. 17-21 (2001).*
(Continued)

*Primary Examiner* — Mohammad M Hoque
(74) *Attorney, Agent, or Firm* — Oblon, McClelland, Maier & Neustadt, L.L.P.

(57) ABSTRACT

A method for self-assembling microelectronic components includes providing a self-aligning substrate having protrusions, each having a thickness greater than 1 μm and an upper face and flanks, the upper face and the flanks being hydrophobic. The method also includes providing dies, each die having a first face and a second hydrophilic face, and providing a self-assembling substrate. Finally, the method includes obtaining, by capillary effect, the self-alignment of each die through the first face thereof on a protrusion of the self-aligning substrate, then obtaining the assembly of the dies through the second hydrophilic face thereof on the self-assembling substrate by direct adhesion. Such a method (Continued)

has application in the industrial production of 3D integrated circuits.

17 Claims, 4 Drawing Sheets

(58) Field of Classification Search
CPC ....... H01L 29/0657; H01L 2224/80006; H01L 2224/80896; H01L 2224/80986; H01L 2224/94; H01L 2224/95001; H01L 2224/95136; H01L 2224/95146; H01L 2224/97; H01L 2924/10156; H01L 21/6835; H01L 24/97; H01L 2224/98; H01L 2224/80894
USPC .......................................................... 438/107
See application file for complete search history.

(56) References Cited

U.S. PATENT DOCUMENTS

| | | | | |
|---|---|---|---|---|
| 8,557,631 | B2* | 10/2013 | Yu | H01L 23/544 438/106 |
| 9,773,741 | B1* | 9/2017 | Gu | H01L 25/0657 |
| 2004/0058423 | A1* | 3/2004 | Albritton | G01N 33/5005 435/173.7 |
| 2004/0154733 | A1* | 8/2004 | Morf | H01L 24/75 156/241 |
| 2006/0226203 | A1* | 10/2006 | Lu | H01L 24/03 228/219 |
| 2007/0269914 | A1 | 11/2007 | Yeh et al. | |
| 2009/0023243 | A1* | 1/2009 | Koyanagi | H01L 24/92 438/107 |
| 2010/0123268 | A1 | 5/2010 | Menard | |
| 2010/0203676 | A1* | 8/2010 | Theuss | H01L 23/3128 438/109 |
| 2010/0248424 | A1* | 9/2010 | Luce | H01L 24/94 438/109 |
| 2011/0033976 | A1* | 2/2011 | Di Cioccio | H01L 24/32 438/107 |
| 2011/0233791 | A1* | 9/2011 | Mastrangeli | H01L 24/95 257/777 |
| 2012/0021563 | A1 | 1/2012 | Koyanagi et al. | |
| 2012/0291950 | A1* | 11/2012 | Sugiyama | H01L 25/0655 156/285 |
| 2012/0292775 | A1* | 11/2012 | Nakamura | H01L 24/83 257/773 |
| 2014/0080261 | A1* | 3/2014 | Arase | H01L 24/83 438/118 |
| 2015/0021191 | A1* | 1/2015 | Li | C25D 11/022 205/136 |
| 2015/0179605 | A1* | 6/2015 | Dubey | H01L 24/33 257/777 |
| 2015/0228622 | A1* | 8/2015 | Koyanagi | H01L 25/0657 257/777 |
| 2015/0303082 | A1 | 10/2015 | Wimplinger et al. | |
| 2018/0068921 | A1* | 3/2018 | Wang | H01L 24/24 |

FOREIGN PATENT DOCUMENTS

| | | |
|---|---|---|
| FR | 3039700 A1 * | 2/2017 |
| WO | WO 97/23945 A1 | 7/1997 |
| WO | WO 2012/133760 A1 | 10/2012 |

OTHER PUBLICATIONS

International Search Report and Written Opinion dated May 28, 2018 in PCT/EP2018/055687, 14 pages.
Römer, G.-W. et al., "Laser Micro-machining of Hydrophobic-hydrophilic Patterns for Fluid Driven Self-alignment in Micro-assembly," Proceedings of LPM2011—the 12$^{th}$ International Symposium on Laser Precision Microfabrication, XP55272596, Jan. 2011 (Total 10 pages).
Ijon, et al., "Three-dimensional Integrated Circuit" Source: https://en.wikipedia.org/wiki/Three-dimensional_integrated_circuit?oldid=725755881, Jun. 17, 2016 (Total 9 pages).
Lee, S. H. et al "Wafer-to-Wafer Alignment for Three-Dimensional Integration: A Review," Journal of Microelectromechanical Systems, vol. 20, No. 4, Aug. 2011 (Total 14 pages).
Berthier, J. et al., "Self-alignment of Silicon Chips on Wafers: A Capillary Approach," AIP, Journal of Applied Physics, vol. 108, 054905, 2010 (Total 11 pages).
Mermoz, S. et al., "High Density chip-to-wafer Integration Using Self-assembly: On the Performances of Directly Interconnected Structures Made by Direct Copper/oxyde Bonding," IEEE 15th Electronics Packaging Technology Conference, 2013 (Total 6 pages).
Mermoz, S. et al., "Impact of Containment and Deposition Method on Sub-Micron Chip-to-Wafer Self Assembly Yield," IEEE International, 2011 IEEE International 3D Systems Integration Conference (3DIC), 2011 (Total 6 pages).

* cited by examiner

METHOD FOR SELF-ASSEMBLING MICROELECTRONIC COMPONENTS

TECHNICAL FIELD OF THE INVENTION

The invention relates to the field of three-dimensional integration of microelectronic components. The invention more specifically relates to a method for self-assembling microelectronic components.

It has a particularly advantageous application in the industrial production of three-dimensional integrated circuits (3D ICs).

In microelectronics, a three-dimensional integrated circuit is an integrated circuit produced by stacking portions (or wafers), in particular made of silicon and/or dies, if necessary functionalised, and interconnecting them to it at least partially vertically using through-silicon vias (TSVs).

STATE OF THE ART

In the scope of the 3D integration of microelectronic components, several approaches have been studied of which the approach called "wafer-to-wafer", the approach called "sequential die-to-die" and the approach called "die-to-wafer".

According to the "wafer-to-wafer" (W2W) approach, dies are produced on two or several semi-conductive material-based wafers which are then aligned, adhered together, and diced into dice to constitute at least the base of many 3D integrated circuits. This approach makes it possible to hybridise numerous dies in one single time, but shows certain limits. First, it has a low qualitative yield, due to it being sufficient that one electronic component on a wafer is faulty such that the stack comprising it is also faulty. Then, it only makes it possible to hybridise microelectronic components of the same size. Moreover, the alignment obtained is that which makes it possible for ad hoc alignment equipment (see, in particular, the article entitled, "Wafer-to-Wafer Alignment for Three-Dimensional Integration: A Review", by Sag Hwui Lee et al., published in the journal, "Journal Of Microelectromechanical Systems", Vol. 20, No. 4, August 2011).

According to the "sequential wafer-to-wafer" approach, a wafer is functionalised before a silicon layer is transferred onto it, or equivalently returned onto it, by direct adhesion. This silicon layer is then itself functionalised and the two stages are thus connected with an alignment which itself is achievable by the functionalisation method used, namely lithography, i.e. a precise alignment of almost a few tens of nanometres. However, this approach faces the implementation of a low-temperature functionalisation technology to functionalise the upper transistor stage, without degrading the transistors of the lower stage (see, in particular, the article entitled, "CoolCube™: A true 3DVLSI Alternative to Scaling", by J.-E. Michallet et al., published in March 2015, in the journal, "Resource Library, Technologies Features 1").

The "die-to-wafer" approach aims to use the functional dies of a wafer and to transfer them, after dicing, onto a wafer functionalised beforehand. This approach has the advantage of raising the qualitative yield problem, due to each transferred die being able to be tested beforehand. Furthermore, this approach makes it possible for a heterogenic integration of microelectronic components. The alignment of the dies on the wafer is generally obtained with robotic machines making it possible for the removal and the positioning of dies for the mechanical assembly thereof. More specifically, each die is positioned individually and mechanically by a robotic arm on the functionalised wafer. These machines are subsequently called "pick-and-place" machines.

Relative to "wafer-to-wafer" and "sequential wafer-to-wafer" approaches, the "die-to-wafer" approach therefore has a major interest. However, there remains numerous blocking points in order to make it industrially viable. In particular, the time necessary to assemble the circuits which becomes more and more longer as a more and more precise alignment is sought to be achieved.

Indeed, by analysing the performances of "pick-and-place" machines, it is observed that it becomes more and more complex to conciliate assembly speed and precision.

More specifically, the "pick-and-place" machines currently present in the market enable an alignment precision of a value of between 0.5 and 2 µm for the most efficient. However, this high alignment precision is obtained systematically at the expense of the assembly speed. As an example, the most precise machines at best have an assembly speed of around 60 dies per hour which is not viable from an industrial standpoint.

Conversely, by relaxing the constraint on the alignment precision, there are currently today machines capable of assembling 100000 dies per hour with an alignment precision of a value substantially equal to 40 µm. However, such an alignment precision is insufficient given the high interconnecting densities (millions per $cm^2$) necessary for the current components.

The "die-to-wafer" approach implementing "pick-and-place" machines does not therefore make it possible to consider an industrial application on a large scale.

To overcome this problem of conciliation between assembly speed and precision, self-assembly techniques have emerged. Mostly, they combine shape recognition or surface affinity in a liquid environment or in air.

In this context, patent document FR 2 988 517 A1 discloses a technique for self-assembling a die on a support based on the confinement of a water drop on a hydrophilic surface surrounded by a hydrophobic surface. Through natural phenomenon of minimising superficial tension forces, the water drop makes it possible to force the alignment of the die on the hydrophilic surface, the adhesion of the die is done by direct adhesion after evaporation of the water. However, to confine the water drop and to obtain a satisfactory self-alignment, it is necessary to arrange the die on a pad or protrusion, with a minimum height of 3 µm, formed beforehand on the support, in order to obtain a sufficient wettability contrast between hydrophilic and hydrophobic surfaces by canthotaxis capillary effect. This protrusion is problematic, as it is difficult to integrate, in particular on wafers processed on which components would have been produced.

Document US 2012/021563 discloses a method for producing a three-dimensional integrated circuit. A carrier substrate comprises a functionalised upper face so as to have hydrophilic zones (substantially of the size of the dies of the circuit) and hydrophobic zones between the hydrophilic zones. This functionalisation makes it possible to achieve the positioning of a water drop, possibly mixed with hydrofluoric acid, on each hydrophilic zone. A die is then brought, by a face made hydrophilic beforehand, on each of the drops positioned. An evaporation of the drops is thus carried out, which makes it possible to obtain the adhesion of each die on a hydrophilic zone of the carrier substrate. A support substrate is brought in contact with the free surface of the dies by an attachment surface to obtain the transfer of the dies on the support substrate following the removal of the carrier substrate. To ensure that the adhesion force between each die and the carrier substrate is less than the adhesion force between each die and the support substrate, it is proposed, either to structure through protrusions, each hydrophilic zone so as to minimise the contact zone between each hydrophilic zone and each die, or to play on a difference in surface roughness between the hydrophilic zones of the carrier substrate and the attachment zone of the support substrate. These solutions are all also necessary and difficult to implement in a controlled manner.

An aim of the present invention is to respond, at least partially, to the limitations exposed above.

SUMMARY OF THE INVENTION

To achieve this aim, according to an embodiment, the present invention provides a method for self-assembling microelectronic components comprising the following steps:
Providing a substrate called self-aligning substrate comprising a plurality of protrusions each having a thickness greater than 1 µm and each having an upper face and flanks, the upper face and the flanks being hydrophobic,
Providing a plurality of dies, each die having a first face and a second hydrophilic face,
Providing a substrate called self-assembling substrate,
Obtaining, by capillary effect, the self-alignment of each die, by the first face thereof, on one single protrusion of the self-aligning substrate, typically according to a "die-to-wafer"-type approach, then
Obtaining the assembly of the plurality of dies on the self-assembling substrate, typically according to a "wafer-to-wafer"-type approach, by direct adhesion on the self-assembling substrate of the second hydrophilic face of each die.

The method according to the invention advantageously disconnects the self-alignment and the self-assembly of the dies. The self-alignment is carried out by capillary effect during a prior step according to a "die-to-wafer"-type approach and the self-assembly is carried out during a subsequent step according to a "wafer-to-wafer"-type approach. The method makes it possible for the self-assembly of dies on a substrate not necessarily having protrusions on the surface thereof and thus overcomes the problem connected to the integration of protrusions on a self-assembling substrate processed. In order to obtain a high adhesion energy between the second face of each die and the self-assembling substrate, the invention preferably provides that the second face of each die, i.e. the face through which each die is transferred by direct adhesion on the self-assembling substrate, is hydrophilic. It is thus ensured, that the direct adhesion energy between each die and the self-aligning substrate is less than the direct adhesion energy between each die and the self-assembling substrate. It is that the upper face of each protrusion, but also the flanks thereof as hydrophobic, makes it possible to ensure a satisfactory confinement of the drop intended to be put on each protrusion.

According to a particularly advantageous embodiment, the self-assembling substrate has a plurality of hydrophilic receiving zones and the obtaining of the assembly of the plurality of dies on the self-assembling substrate comprises at least the alignment of the self-aligning substrate and of the self-assembling substrate, such that each die is located opposite a hydrophilic receiving zone of the self-assembling substrate and is transferred by direct adhesion on the hydrophilic receiving zone located opposite.

The method according to the latter particularity, makes it possible to best ensure that the direct adhesion energy between each die and the self-aligning substrate is less than the direct adhesion energy between each die and the self-assembling substrate.

Another aspect of the present invention relates to a method for producing at least one microelectronic component, such as a three-dimensional integrated circuit, implementing the self-assembly method such as introduced above.

Another aspect of the present invention relates to a microelectronic component, such as a three-dimensional integrated circuit, produced according to a production method implementing the self-assembly method such as introduced above.

By microelectronic component, this means any type of device produced with microelectronic means. These devices in particular, in addition to devices with a purely electronic purpose, comprise micromechanical or electromechanical (MEMS, NEMS, etc.) devices, as well as optical or optoelectronic devices (MOEMS, etc.).

BRIEF DESCRIPTION OF THE FIGURES

The aims, objectives, as well as the features and advantages of the invention will best emerge from the detailed description of embodiments of the latter, which are illustrated by the following supporting drawings, wherein.

Figure 1:
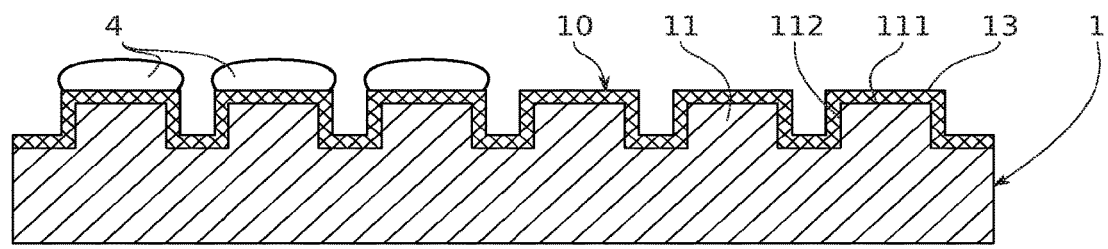
FIGS. 1 to 4 are schematic representations of different steps of a self-assembly method according to an embodiment of the invention.

The drawings are given as examples and are not limiting of the invention. They constitute schematic principle representations intended to facilitate the understanding of the invention and are not necessarily to the scale of practical applications. In particular, the relative thicknesses of the different layers and films are not representative of reality.

DETAILED DESCRIPTION OF THE INVENTION

Before starting a detailed review of embodiments of the invention, optional features are mentioned below which can possibly be used in association or alternatively:
Advantageously, to gain alignment precision, and in particular to achieve an alignment precision less than one micron, the at least one die can have a first protruding face, i.e. that the first face will be of a reduced dimension with respect to the size of the die, the die having a mesa at the edge of the first face thereof. This mesa makes it possible to significantly improve the wettability contrast between the first face and the flanks of the die, making it possible for a better localisation of the drop and therefore a more precise alignment;

The self-aligning substrate comprising a front face structured by said at least one protrusion, providing the self-aligning substrate can comprising the following step: treating the front face of the self-aligning substrate to make hydrophobic, even superhydrophobic:
- at least the upper face and the flanks of said at least one protrusion, and
- potentially the whole front face of the self-aligning substrate.

The method according to the invention thus makes it possible to ensure that the direct adhesion energy between each die and the upper face of the corresponding protrusion is low, and in particular lower than an adhesion energy between each die and a surface not made hydrophobic. More specifically, treating the front face of the self-aligning substrate can comprise at least one from among the following steps:
- said at least one protrusion being silicon-based, treating at least the upper face thereof and the flanks thereof with hydrofluoric acid, in an aqueous solution, for example at a concentration of 1% hydrofluoric acid, or in vapour form,
- depositing a layer of a fluorinated polymer, preferably a fluorocarbon polymer, at least on the upper face and the flanks of said at least one protrusion, for example by exposing to a plasma formed from octafluorobutene, hexafluoroethane, de carbon tetrafluoride 20 and/or trifluoromethane,
- depositing a polydimethylsiloxane (or PDMS) layer at least on the upper face and the flanks of said at least one protrusion,
- depositing an SiOC layer at least on the upper face and the flanks of said at least one protrusion, for example by chemical vapour deposition (CVD), assisted by a plasma by using a gas comprising silicon, a gas containing oxygen and a gas containing carbon,
- the self-aligning substrate being silicon (Si)-based, etching the self-aligning substrate with plasma so as to obtain black silicon at least on the upper face and the flanks of said at least one protrusion, and
- the self-aligning substrate being silicon (Si)-based, etching the self-aligning substrate with plasma so as to obtain black silicon and depositing a layer of a fluorinated polymer, preferably a fluorocarbon polymer, at least on the upper face and the flanks of said at least one protrusion.

Numerous methods to make a surface hydrophobic, even superhydrophobic, can therefore be considered here.

Obtaining the self-alignment of a die on a protrusion of the self-aligning substrate can comprise at least the successive following steps:
- depositing a drop of a liquid comprising for example water on one from among the upper face of the protrusion and the first face of the die, the drop preferably having a volume of between 0.5 and 2 µL, even more preferably of between 0.8 and 1.2 µL,
- bringing the die onto the protrusion such that the drop is deposited between the die and the protrusion and thus obtaining the self-alignment of the die on the protrusion by capillary effect, and
- making the drop evaporate so as to obtain the direct adhesion of the die, through the first face thereof, on the upper face of the protrusion.

The method according to the invention thus makes it possible to obtain a micrometric self-alignment for 90% of dies on the self-aligning substrate, that is a high yield self-alignment, both qualitative and quantitative;

Obtaining the self-alignment of a die on a protrusion of the self-aligning substrate can comprise, when a die is not aligned following the evaporation of the drop, at least the successive following steps:
- moving the non-aligned die away from the protrusion,
- cleaning at least one from among the upper face of said protrusion from which the die has been moved away and the first face of the die, and
- transferring the die through the first face thereof on said protrusion so as to obtain the alignment and the adhesion of the die on said protrusion.

The method according to the invention thus makes it possible to correct possible alignment errors observed to extend to achieve the alignment for 100% of dies. When the dies are already mainly aligned with a micrometric precision, the use of a high-precision "pick-and-place" machine can be industrially considered to correct the alignment of the other dies;

At least when several dies are of thicknesses which are substantially different from one another, providing the self-aligning substrate can comprise at least the following step: depositing a layer of a compressible polymer, for example a polydimethylsiloxane (or PDMS) layer, at least under one of the protrusions, so as to be able to absorb, by compression, the thickness differences between dies, in particular during the obtaining of the assembly of dies on the self-assembling substrate. This particularity of the method according to the invention illustrates the fact that it makes it possible to achieve a heterogenic hybridisation in terms of thicknesses of dies;

said at least one protrusion has a thickness, preferably greater than 8 µm. The thickness of the protrusions does not actually have an upper limit value. However, it can be preferred that the thickness of the protrusions does not exceed 80 µm;

Providing said at least one die can comprise a step of singularising the die by dicing a donor substrate, for example by dicing with a laser or with a dicing saw or by plasma dicing. In this case, the two faces of the die will have the same dimension. Laser dicing or dicing with a dicing saw will make it possible to obtain an alignment precision or around, even equal to, or greater than 3 µm. Plasma dicing makes it possible to obtain an alignment precision less than 3 µm, even less than 1 µm. It is also possible to obtain a precision less than 3 µm, even less than 1 µm, to proceed with a lithography followed by an etching of the donor substrate to precisely define the first face of the die. If the donor substrate is thin, this step can be sufficient to singularise the die. If the substrate is thicker, a subsequent laser dicing or dicing with a dicing saw step can be resorted to, to singularise the die. In the latter case, the second face of the die will be slightly removed with respect to the die. Each die is thus advantageously provided by perfectly defining the first face of the die, through which it is intended to be self-aligned on a protrusion of the self-aligning substrate;

Alternatively or complementarily to the preceding feature, providing at least one die can comprise at least the following successive steps:
- Possibly defining the flanks of the first face of the die by etching a donor substrate on a depth greater than 1 µm and less than 100 µm,
- Singularising said at least one die by etching the donor substrate, preferably on a depth substantially equal to 100 µm, for example by photolithography, and Dicing said at least one die from the donor substrate, for example by laser dicing or dicing with a dicing saw;

Providing said at least one die can comprise the following step: treating the die so as to functionalise it, in particular on at least one from a second face, a first face and a first tapered of the die. This particularity of the method according to the invention illustrates the fact that it makes it possible to carry out a heterogenous hybridisation in terms of functionalities of dies;

Providing said at least one die can further comprise the following step: preparing the die such that the first face thereof is hydrophobic and has more specifically a contact angle greater than or equal to 20°, the first face being that by which the die is intended to be self-aligned on a protrusion. The steps consisting of providing said at least one die and of providing the self-aligning substrate can be carried out such that the upper face of each protrusion and the die intended to be self-aligned on this protrusion are substantially of the same dimensions;

According to an embodiment, the second face of the die has a surface greater than the first face of the die;

According to an embodiment, the die has a protrusion by which it is intended to be fixed to the corresponding protrusion of the self-aligning substrate, this protrusion of the first face of the die having a surface less than the surface of the second face of the die;

According to an embodiment, the protrusion of the first face of the die has a surface equal to substantially equal to that of the corresponding protrusion of the self-aligning substrate. This makes it possible to facilitate the self-centring of the die on the corresponding protrusion of the self-aligning substrate. Alternatively, the protrusion of the first face of the die has a surface less than that of the corresponding protrusion of the self-aligning substrate;

Providing a self-assembling substrate can comprise technological steps so as to functionalise it, these technological steps comprising, for example, at least one from among the following steps:
  generating a layer of a dielectric material on a portion of the face of the self-assembling substrate on which one or said at least one die is intended to be assembled, by surface oxidation and/or deposition,
  generating a layer of a conductive material on a portion of the face of the self-assembling substrate on which a die is intended to be assembled, so as to form, if necessary, conductive interconnecting tracks, in particular made of copper, and
  generating through-vias in one portion at least of the thickness of the self-assembling substrate, and in particular through the face of the self-assembling substrate on which a die is intended to be assembled.

The self-assembling substrate can thus be a substrate more specifically intended to functionally form part, in fine, of microelectronic components produced by implementing the method according to the invention;

Obtaining the assembly of said at least one die on the self-assembling substrate can comprise at least the following successive steps:
  transferring, through one of the faces thereof, the self-assembling substrate on the second hydrophilic face of each die, if necessary this transferring being carried out by using an item of alignment equipment called "wafer-to-wafer", with or without tracking,
  adhering, by direct adhesion, the self-assembling substrate on the second hydrophilic face of each die and annealing the assembly, such that the adhesion energy between each die and the self-assembling substrate is greater than the adhesion energy between each die and the self-aligning substrate, and
  separating the self-aligning and self-assembling substrates from one another so as to remove each die from the self-aligning substrate and obtaining the transfer of each die on the self-assembling substrate.

The method thus makes it possible for the assembly of numerous dies according to a "wafer-to-wafer"-type approach, in particular without needing the implementation of a transfer substrate between a donor substrate and a receiving substrate; it must be noted that the self-aligning substrate can easily be reused, possibly after a new surface preparation;

The method can further comprise, after having obtained the assembly of at least one first die on the self-assembling substrate, at least the following steps:
  providing a second self-aligning substrate comprising at least one protrusion having an upper face and hydrophobic flanks, said at least one protrusion of the second self-aligning substrate having, if necessary, a thickness greater than the thickness of said at least one protrusion of the self-aligning substrate provided beforehand,
  providing at least one second die having a first face and a second face opposite one another and having a thickness, significantly different from the thickness of said at least one die provided beforehand, the second face of said at least one second die being hydrophilic,
  obtaining, by capillary effect, the self-alignment of said at least one second die, through the first face thereof, on the at least one protrusion of the second self-aligning substrate, typically according to a "die-to-wafer"-type approach, then
  obtaining the assembly of said at least one second die on the self-assembling substrate, typically according to a "wafer-to-wafer"-type approach, for example in a placement of the self-assembling substrate different from the placement of said at least one first die, by direct adhesion on the self-assembling substrate of the second face of said at least one second die.

This particularity of the method according to the invention illustrates the fact that it makes it possible to achieve a heterogenous hybridisation in terms of varied sizes and placement of integration of the dies.

The use of the indefinite article "a" or "an" for an element or a step does not exclude, except for any mention otherwise, the presence of a plurality of such elements or steps.

It is specified that in the scope of the present invention, the term "on", "surmounts", "covers" or "underlying" or the equivalents thereof do not necessarily mean, "in contact with". Thus, for example, the deposition of a first layer on a second layer, does not compulsorily mean that the two layers are directly in contact with one another, but this means that the first layer covers at least partially the second layer, either by being directly in contact with it, or by being separated from it by at least one other layer or at least one other element.

By "die", this means, a piece, generally of the shape of a rectangular parallelepiped, of a semi-conductive material-based matrix, on which an electronic integrated circuit is intended to be, or has been, produced. Dies are obtained by dicing portions of the semi-conductive material-based matrix on which are intended to be, or have been, reproduced, often identically, one or even more electronic circuits by a succession of different steps, in particular technological steps such as photolithographic, ionic implant, thin layer deposition steps, etc.

By "(electronic) hybridisation", this means the assembly of two electronic components, such as two dies, in view of obtaining a combined function or a denser assembly.

By "self-assembly", this means the role of an assembly technique wherein, when elements to be assembled are placed under specific conditions, these elements are assembled spontaneously to form a structure.

By "self-alignment", this means the action by which, when elements to be aligned are placed under specific conditions, these elements are aligned spontaneously.

By "hydrophobic", this means the property of a surface of a solid material on which a water drop forms, when it is balanced with ambient air, a contact angle greater than or equal to 20°, preferably greater than 60°, even more preferably, greater than 65°.

By "superhydrophobic", this means the physical property, such as a structuring, of a surface of a solid material on which a water drop forms, when it is balanced with ambient air, a contact angle greater than or equal to 150°.

By "hydrophilic", this means the property of a surface of a solid material on which a water drop forms, when it is balanced with ambient air, a contact angle less than 10°, preferably less than 5°, and even more preferably substantially equal to 2°.

In the following description, the substrate, film, layer, die or protrusion thicknesses are generally measured along a direction perpendicular to the main extension plane of the substrate, of the film, of the layer, or the die or of the protrusion.

By a material A-"based" substrate, film, layer, die or protrusion, this means a substrate, a film, a layer, a die or a protrusion comprising this material A and possibly other materials, for example doping elements.

The term, "coating" corresponds to a layer which is formed, in particular by modification of the underlying layer or by a deposition on this underlying layer.

The word "dielectric" qualifies a material of which the electrical conductivity is sufficiently low in the given application to be used as an insulator.

By "direct adhesion", this means an adhesion without adding adhesive material (of the glue or polymer type, in particular), which consists of putting relative smooth surfaces in contact (of a roughness typically less than 5 Å), for example carried out at ambient temperature and under ambient atmosphere, in order to create an adhesion to one another.

According to an embodiment, the direct adhesion of two components means that the adhesion is obtained by chemical bonds which are established between the two surfaces put in contact. The two surfaces have sufficiently low roughness such that the Van der Waals forces ensure, preferably to only them, a maintaining of the two components to one another.

The direct adhesion is furthermore obtained without requiring the application of a significant pressure on the structure of be assembled. A light pressure can simply be applied to initiate the adhesion.

The direct adhesion involves (or not) an intermediate adhesion layer (for example, a silicon oxide layer). Thus, the adhesion interface between two substrates can comprise an intermediate layer.

Each surface intended to be transferred by direct adhesion can be prepared for a good quality direct adhesion. The level of roughness acquired can be obtained by a suitable deposition or after a mechanical/chemical polishing step. According to the surface, an SC1 or SC2 type cleaning will be used, $O_2$ or UV/ozone (surface with oxide) plasma, an He/H preparation for copper or copper/oxide surfaces with possibly a cleaning with a roller-brush called a "scrubber", as well as a drying.

By "adhesion energy" between two elements, this means the energy necessary to achieve the separation of these two elements.

Figure 5:
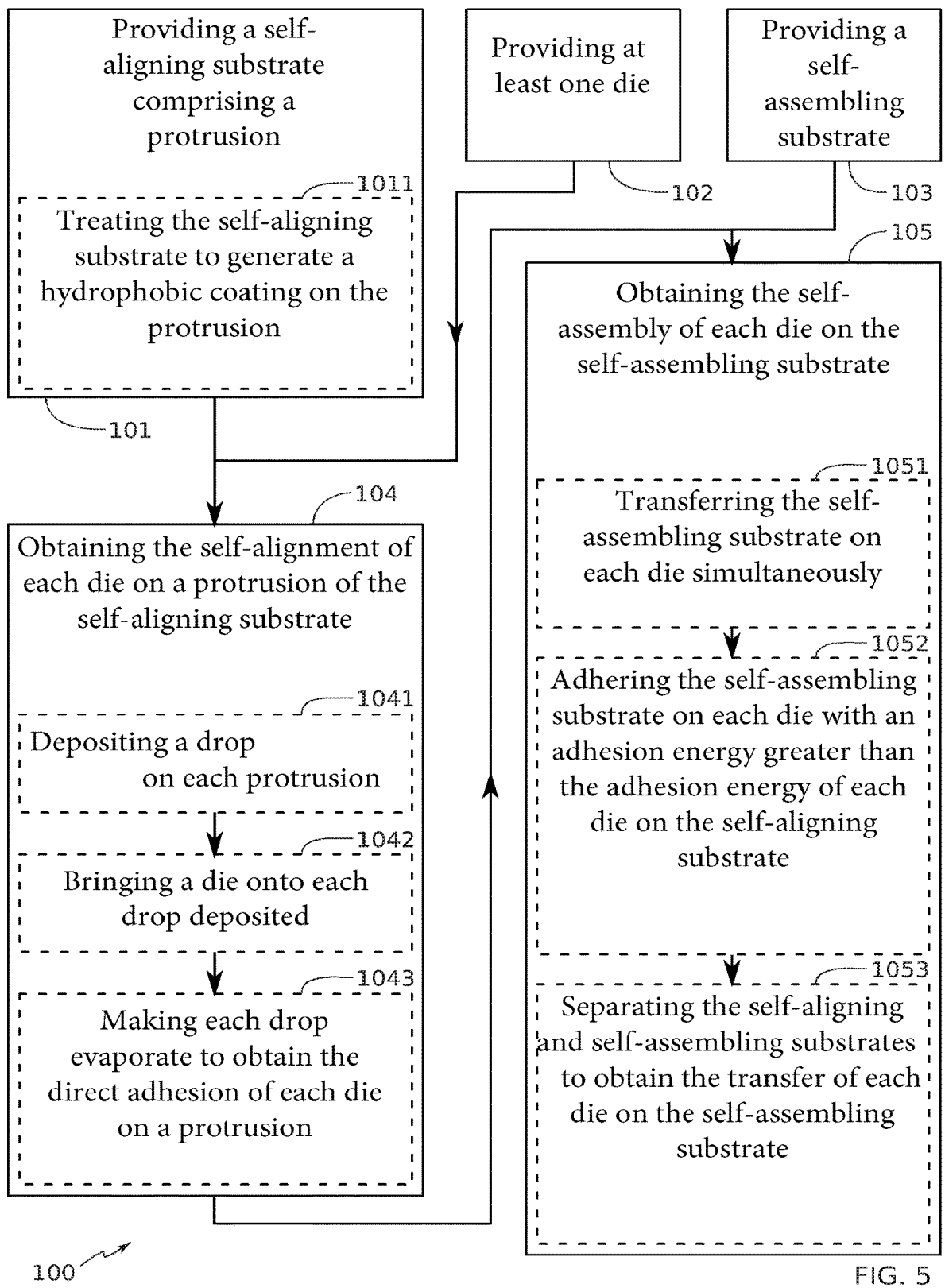
FIG. 5 is a flowchart of different steps of the self-assembly method according to an embodiment of the invention.

In reference to FIG. 5, the method 100 for self-assembling microelectronic components comprises at least the following steps:

Providing 101 a substrate called self-aligning substrate 1 comprising at least one protrusion 11, Providing 102 at least one die 2, Providing 103 a substrate called self-assembling substrate 3, Obtaining 104 the self-alignment of each die 2 on a corresponding protrusion 11 of the self-aligning substrate 1, then Obtaining 105 the assembly of each die 2 on the self-assembling substrate 3.

The method 100 according to the invention aims to be implemented industrially. In this perspective, it can preferred to provide 101 a self-aligning substrate 1 comprising a front face 10 structured by a plurality of protrusions 11 and to provide 102 a plurality of dies 2, each die 2 being intended to be self-aligned on a corresponding protrusion 11.

According to certain preferably features of the method 100:

the protrusions 11 can have an upper face 111 and flanks 112, the upper face and the flanks being hydrophobic, even superhydrophobic, or provided with a hydrophobic coating 13, even superhydrophobic, and/or the obtaining 104 of the self-alignment of each die 2 on a protrusion 11 is obtained by capillary effect, i.e. under the effect of return forces of a drop inserted between the die 2 and the protrusion 11, and/or the obtaining 105 of the assembly of dies 2 on the self-assembling substrate 31 can be achieved by direct adhesion.

It is not excluded that the self-aligning substrate 1 and the protrusions 11 thereof are hydrophobic material-based.

In particular, in reference to FIG. 1, a plurality of protrusions 11 is formed on the surface of an initial substrate. For example, the protrusions can be formed by photolithography, in other words, by an industrial etching method, perfectly controlled and making it possible to obtain self-aligning substrates 1, both varied and specific in terms of placements and sizing of the protrusions 11. This method makes it possible also to precisely define the shape, the thickness and the transversal dimensions of the protrusions 11. However, the invention is not limited to this method for forming protrusions 11. Indeed, according to another example, the protrusions 11 can be formed individually, for example by dicing of base substrate, then transferred on the initial substrate which thus forms the base of the self-aligning substrate 1; this transfer thus comprises the adhesion of the protrusions 11, for example, by polymeric adhesion on the front face of the initial substrate. This adhesion must have an energy greater than the adhesion energy which will be obtained between the die 2 and the protrusion 11 if it is sought to be able to subsequently separate the die 2 and the protrusion 11 at the level of the adhesion interface thereof. The interest of this technique is to make it possible to insert, between the initial substrate and the protrusions 11, a flexible buffer layer, for example, compressible polymer-based, which could absorb during the subsequent adhesion of the height differences between certain protrusions and/or certain dies 2.

In reference to FIG. 1, the protrusions 11 preferably substantially have the shape of a parallelepiped. More specifically, each protrusion 11 has flanks 112 and an upper face 111, preferably substantially flat. Preferably, each protrusion is formed such that the upper face 111 thereof is substantially of the same dimensions as the die 2, intended to be self-aligned on this protrusion 11. In particular, in order to benefit from the canthotaxis capillary effect, which will be revisited below, each protrusion 11 preferably has a thickness greater than 1 µm, preferably of between 8 µm and 80 µm.

If not only the upper face 111, but also the flanks 112, of each protrusion 11 are hydrophobic, this makes it possible to ensure a satisfactory confinement of the drop 4 intended to be placed on the upper face 111 of the protrusion 11. In this sense, that the thickness of each protrusion is greater than 1 µm is also significant. Furthermore, using a hydrophobic protrusion makes it possible to obtain a much better alignment that with a hydrophilic surface, as well as an adhesion, low in energy, which remains low, even after a thermal treatment, for example up to 400° C., and which is easily removed.

If the self-aligning substrate 1 and/or the protrusions 11 are not hydrophobic by nature, the self-aligning substrate 1011 can be treated at the level of the front face 10 thereof to make it hydrophobic, even superhydrophobic, and/or generating a hydrophobic, even superhydrophobic coating 13, at least at the level of the upper faces 111 and of the flanks 112 of the protrusions 11. As illustrated in FIG. 1, the whole front face 10 of the self-aligning substrate 1 can be (made) (super)hydrophobic. The method 100 according to this particularity makes it possible to ensure that the direct adhesion energy between each die 2 and the upper face 111 of the corresponding protrusion 11 is low, in particular lower than an adhesion energy between each die 2 and a non-hydrophobic (made) surface, and in particular a lot lower than a fracture energy of the self-aligning substrate 1. Furthermore, when the self-alignment of the dies 2 on the self-aligning substrate 1 is obtained by capillary effect, as will be described in detail below, the (super)hydrophobia of the upper face 111 of the protrusions 11 makes it possible to achieve a micrometric self-alignment for around 90% of dies 2, that is a high-yield self-alignment that is both qualitative and quantitative.

Numerous methods for generating a (super)hydrophobia can be considered which make it possible to reach either a hydrophobic or superhydrophobic level for an adaptability, case by case, of the method according to the invention. Among these methods, those comprising at least one of the following steps can be mentioned:

when the protrusion is made of silicon, treating at least the upper face 11 and the flanks 112 of this protrusion 11 with hydrofluoric acid, either in an aqueous solution, for example at a concentration of 1% hydrofluoric acid, or in vapour form, depositing a layer of a fluorinated polymer, preferably a fluorocarbon polymer, at least on the upper face 111 and the flanks 112 of the protrusion 11, for example, by exposure to a plasma formed from octafluorobutene, hexafluoroethane, carbon tetrafluoride 20 and/or trifluoromethane, depositing a polydimethylsiloxane (or PDMS) layer, at least on the upper surface 111 and the flanks 112 of the protrusion 11, depositing an SiOC layer at least on the upper face 111 and the flanks of the protrusion 11, for example by plasma-assisted chemical vapour deposition (CVD) by using a gas comprising silicon, a gas containing oxygen and a gas comprising carbon, when the self-aligning substrate 1 is silicon Si-based, etching the self-aligning substrate 1 by plasma so as to obtain black silicon at least on the upper face 111 and the flanks 112 of the protrusion 11, and possibly then depositing a layer of a fluorinated polymer, preferably a fluorocarbon polymer, at least on the upper face 111 of the protrusion 11.

Step 102 of providing at least one die 2 will now be described in more detail.

As indicated above, a die 2 is understood here as a piece, generally of the shape of a rectangular parallelepiped, of a semi-conductive material-based matrix, such as silicon, or of a stack of layers on which an electronic integrated circuit is intended to be, or has been, produced. More specifically, each die 2 has a first face 20 and a second face 22, preferably substantially flat; the transversal dimensions thereof, going for example from a few millimetres and to a few tens of millimetres, are greater, of at least one order of magnitude, that the thickness thereof such that each die 2 has a significant shape factor, itself conferring in particular a self-aligning capacity by capillary effect as is described in the article by J. Berthier et al., entitled, "Self-alignment of silicon chips on wafers: A capillary approach", published in "Journal of Applied Physics" of 2010, vol. 108. Each die 2 can be formed such that the first face 20 thereof, often identical to the second face 22 thereof, is substantially of the same dimensions as the upper face 111 of the protrusion 11 on which it is intended to be self-aligned. Advantageously, the first face 20 will protrude, so as to improve the alignment obtained by self-assembly.

Furthermore, the dies 2 can be treated so as to be functionalised. This functionalisation can be carried out on at least one from among the second face 22 and the first face 20 of each die 2. Thus, it appears that the self-assembly method according to the invention can make it possible to achieve a heterogenous hybridisation in terms of functionalities of the dies 2.

Figure 2:
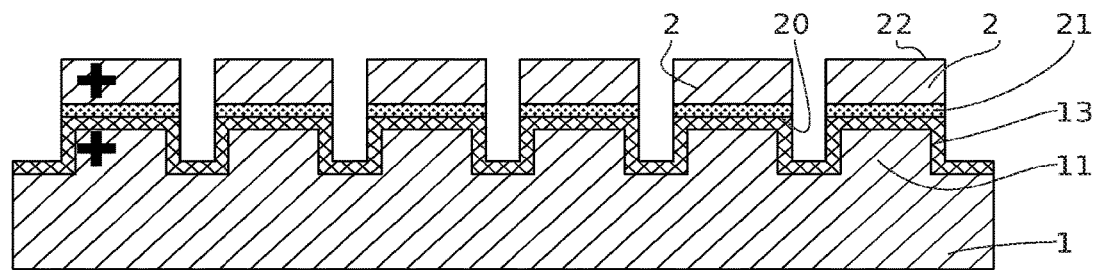
Figure 3:
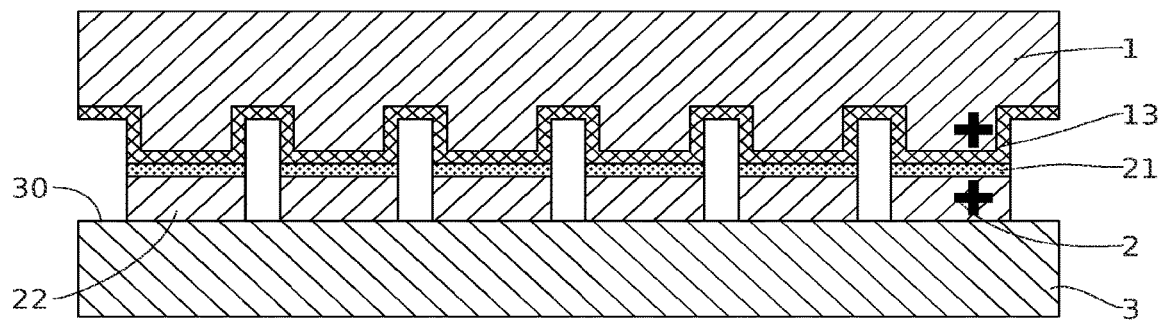

Moreover, in reference to FIGS. 2 and 3, the supply 102 of dies 2 can comprise at least the following step: preparing the first face 20 of each die 2 to generate a hydrophobic or not very hydrophobic surface and having more specifically a contact angle greater than or equal to 20°. Even if this also improves the alignment, it is not necessary that the first face of each die 2 is (made) hydrophobic. Indeed, the fact that the surface of the protrusion 11 is hydrophobic is sufficient to obtain a bad quality adhesion which can be easily disconnected.

On the contrary, advantageously the second face 22 will be prepared to make it hydrophilic in order to obtain a high adhesion energy between this second face 22 and the self-assembling substrate 3, in particular after annealing (typically of between 1 and 4 $J/m^2$). The adhesion energy obtained between the second face 22 of each die 2 and the self-assembling substrate 3 must in particular be greater than the adhesion energy between the first face 20 of each die 2 and the self-aligning substrate 1. The preparation of the surface of the second face 22 of each die 2 can comprise the deposition of a suitable surface coating, for example the deposition of an oxide layer. In a variant or complementarily, the surface preparation of the second face 22 of each die 2 can thus comprise a surface oxidation. Also, the adhesion energy can be modulated by playing on the roughness of the surfaces to be adhered.

This die can be tapered if needed at different times, and in particular before alignment on the self-aligning substrate 1 or after assembly on the self-aligning substrate 1 if the assembly energy makes it possible, or also after transferring on the self-assembling substrate 3.

Below, in reference to FIGS. 1, 2 and 5, it will be described how to obtain 104, by capillary effect, the self-alignment of the dies 2 on the protrusions 11 of the self-aligning substrate 1 according to an embodiment of the invention.

To do this, step 104 can comprise at least the successive following steps:
- Depositing 1041 a drop 4 of a liquid on the upper face 111 of the protrusion 11, as is schematically represented on three protrusions of the self-aligning substrate 1 illustrated in FIG. 1,
- Bringing 1042 each die 2 onto a corresponding protrusion 11 of the self-aligning substrate 1, such that the drop 4 is arranged between the die 2 and the protrusion 11 and thus obtaining the self-alignment of the die 2 on the protrusion 11, and
- Making the drop 4 evaporate 1043, so as to obtain the direct adhesion of each die 2, through the first face 20 thereof, on the upper face 111 of the protrusion, as it represented schematically in FIG. 2.

As described above, the upper face 111 and the flanks 112 of each protrusion 11 can have been made hydrophobic prior to the deposition 1041 of the drop 4, and this in particular in order to ensure a good confinement of the drop 4 on the protrusion 11. Also, as described above, the first face 20 of each die 2 can have been made prior to the bringing 1042 thereof onto the corresponding protrusion 11, in particular to obtain a better alignment of the die 2 on the protrusion 11.

The liquid of each drop 4 can comprise water, if necessary mixed with hydrofluoric acid, the latter remaining as a low concentration (typically less than one percent). Water is imposed here as the main component of the liquid of each drop 4, due to it being of current use, but other liquid, preferably with a high surface tension could also be used.

Each drop 4 preferably has a volume of between 0.5 and 2 µL, even more preferably of between 0.8 and 1.2 µL. Below these volume values, the deposition of the die 2 on the protrusion 11 risks resulting in a direct contact between the die 2 and the protrusion 11, this direct contact actually being an attachment point likely to impede the alignment of the die 2 on the protrusion 11. Above these volume values, the drop 4 could no longer be confined on the protrusion 11 and overflowing, but in particular the evaporation time of the drop 4 becomes significant, in particular in the perspective of an industrial implementation of the method according to the invention. It must be noted, that the volume of the drop 4 depends proportionally on the surface of the upper face 111 of the protrusion 11. The abovementioned ranges of values are particularly suitable for an upper face 111 of a surface of 0.5 cm×0.5 cm to 1 cm×1 cm.

The drop 4 is such, and is deposited such that it preferably forms a contact angle greater than 60°, preferably greater than 65°, with the upper face 111 of the protrusion 11, under normal temperature and pressure conditions. When the first face 20 of the die 2 protrudes, a wettability contrast of around 150° is thus obtained, the mesa at the face edge introducing an additional angle of 90° guaranteeing the precise self-alignment of the dies 2. If a hydrophobic, even superhydrophobic coating 13, is generated on the upper face 111 of each protrusion 11 certainly advantageously makes it possible to increase the value of this contact angle, but in particular makes it possible to reduce the direct adhesion energy between each die 2 and the upper face 111 of each protrusion.

The bringing 1042 of each die 2 onto the corresponding protrusion 11 can be achieved by implementing a "pick-and-place" machine with an alignment precision of a value greater than 10 µm, preferably greater than 20 µm. Indeed, in the perspective of industrialising the method according to the invention, it can advantageously be considered to use a low-precision and high-speed "pick-and-place" machine to carry out this supply step 1042. The micrometric precision of the alignment of each die 2 is obtained by capillary effect, linked to the natural phenomenon of minimising superficial tension forces, such that the use of the "pick-and-place" machine can consist only of bringing each die into an approximate position, specific to making it possible to subsequently observe this phenomenon.

The direct adhesion of the die 2 self-aligned on the protrusion 11 is obtained spontaneously once the drop 4 has evaporated.

The step consisting of making the drop 4 evaporate 1043 is advantageously carried out by natural evaporation.

The method 100 according to the invention thus makes it possible to obtain the micrometric self-alignment of around 90% of dies 2 on the self-aligning substrate1, that is a high-yield self-alignment that is both qualitative and quantitative.

Furthermore, the method 100 according to the invention also makes it possible to correct possible alignment errors observed to extend to achieve the 100% alignment of the dies 2. Indeed, according to the method of the invention, obtaining 104 the self-alignment of each die 2 on the corresponding protrusion 11 can comprise, when a die 2 is non-aligned following the evaporation 1043 of the drop 4, at least the successive following steps:
- taking away, even removing, the non-aligned die 2,
- cleaning the upper face 111 of the protrusion 11 from which the die 2 has been taken away, even removed, and
- bringing back, even re-adhering, the die 2, through the first face 20 thereof, onto the protrusion 11 of which the upper face 111 has been cleaned, so as to obtain the alignment of the die 2 on the protrusion 11.

The removal of the non-aligned die 2 is all the more easier than the direct adhesion energy between the die 2 and the protrusion 11 is made low by the hydrophobic coating 13.

The cleaning of the upper face of a protrusion 11 is all the more easier than the protrusion being already singularised on the self-aligning substrate 1 due to the deep projection thereof with respect to the remainder of the front face 10 of the self-aligning substrate 1.

When the dies 2 are already mainly aligned with a micrometric precision, for example by using a capillary effect self-alignment method, the use of a high-precision "pick-and-place" machine can be industrially considered to correct the alignment of the other dies 2, and in particular to re-adhere the die 2 on the protrusion 11.

Below, in reference to FIGS. 3, 4 and 5, it will be described how to obtain 105 the assembly of the dies 2 on the self-assembling substrate 3 according to an embodiment of the invention.

To do this, step 105 can comprise at least the successive following steps:

Transferring 1051, through one 30 of the faces thereof, the self-assembling substrate 3 on a second face 22 of each die 2, Adhering 1052, by direct adhesion, preferably hydrophilic, the self-assembling substrate 3 on the second face 22 of each die 2 and annealing the assembly, such that the adhesion energy between each die 2 and the self-assembling substrate 3 is greater than the adhesion energy between each die 2 and the self-aligning substrate 1, and Separating 1053 the self-aligning 1 and self-assembling 2 substrates to one another so as to remove the dies 2 from the self-aligning substrate 1 and obtaining the transfer of the dies 2 on the self-assembling substrate 3.

The self-assembling substrate 3 can have a plurality of hydrophilic receiving zones. In this case, obtaining 105 the assembly of the plurality of dies 2 on the self-assembling substrate 3 comprises at least the alignment of the self-aligning substrate 1 and of the self-assembling substrate 3, such that each die 2 is located opposite a hydrophilic receiving zone of the self-assembling substrate 3 and is transferred by direct adhesion on the hydrophilic receiving zone opposite it. With the die 2 having a second hydrophilic face 22, this face is therefore found to be adhered to a receiving zone of the self-assembling substrate 3 which is itself also hydrophilic: a direct hydrophilic adhesion is thus obtained between the second face 22 of each die 2 and the self-assembling substrate 3. The annealing already mentioned above thus makes it possible to also reinforce the adhesion between the second hydrophilic face 22 of each die 2 and the corresponding hydrophilic receiving zone of the self-assembling substrate 3. This annealing can more specifically consist of a thermal treatment at a temperature of between 200 and 400° C. This treatment makes it possible to also reinforce the hydrophilic adhesion between each die 2 and the self-assembling substrate 3 at the expense of the hydrophobic adhesion between each die 2 and the self-aligning substrate 1 which itself remains of the same energy, is even degraded, during the annealing with the maturing of adhesion defects in temperature, these defects could even lead directly to the separation of the self-aligning substrate 1 and the first faces 21 of the dies 2. This separation mechanism can also be facilitated by selecting materials having different thermal dilatation coefficients between the self-assembling substrate 3 and the self-aligning substrate 1.

The transferring 1051 of the self-assembling substrate 3 on the front faces 22 of the dies 2 can be achieved by using an item of alignment equipment called wafer-to-wafer, with or without tracking. Markers are represented in FIGS. 3 and 4 by crosses.

Figure 4:
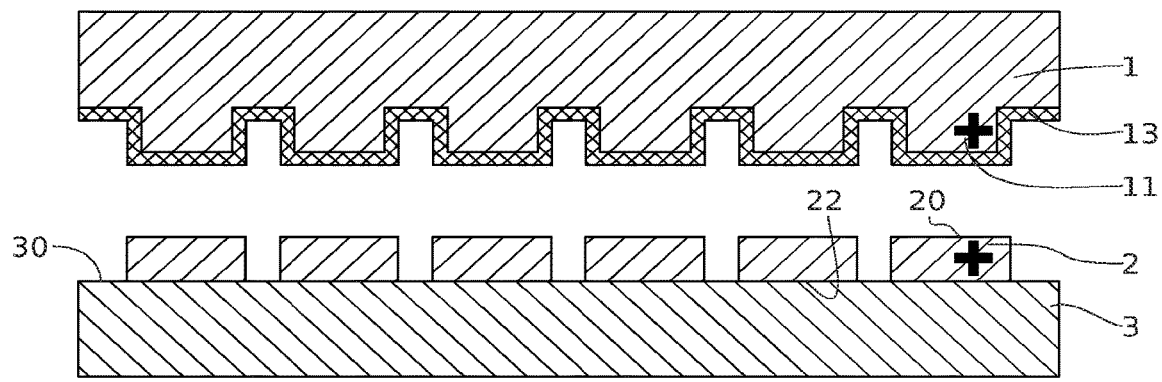

As illustrated in FIGS. 2 to 4, the front faces 22 of the self-aligned dies 2 are preferably comprised in one same plane, so as to make it possible for a substantially flat face 30 of the self-assembling substrate 3 to come into contact with the front faces 22 of the self-aligned dies 2 totally and simultaneously. However, as discussed below, the method 100 according to the invention is not limited to this preference.

The method 100 according to the invention thus makes it possible for the assembly of numerous dies 2 according to a "wafer-to-wafer"-type approach, in particular without requiring the implementation of a transfer substrate between a donor substrate and a receiving substrate.

Furthermore, the self-assembling substrate 3 can be functionalised, in particular prior to the transferring 1051 thereof, so as to ensure functions, in particular, interconnecting functions between 2D or 3D microelectronic component dies.

Indeed, supplying 103 the self-assembling substrate 3 can comprise technological steps so as to functionalise the self-assembling substrate 3. These technological steps can comprise, for example, at least one from among the following steps:

generating a layer of a dielectric material on a portion of a face 30 of the self-assembling substrate 3 on which the dies 2 are intended to be assembled, generating a layer of a conductive material on a portion of a face 30 of the self-assembling substrate 3 on which the dies 2 are intended to be assembled, and generating through-vias in one portion at least of the thickness of the self-assembling substrate 3, and in particular through the face 30 of the self-assembling substrate 3 on which the dies 2 are intended to be assembled.

Generating the dielectric material layer can comprise a surface oxidation, in particular when the self-assembling substrate 3 is silicon-based, or a deposition, for example, of a semi-conductive material-based oxide constituting the self-assembling substrate 3.

The dielectric material layer and the conductive material layer can be generated so as to form conductive interconnecting tracks, in particular made of copper as is described in particular in the article by S. Mermoz, entitled, "High density chip-to-wafer integration using self-assembly: on the performances of directly interconnected structures made by direct copper/oxide bonding", published in the scope of the conference, "Electronics Packaging Technology" of 2013.

The method 100 according to the invention thus makes it possible to interconnect dies 2 to one another only by the assembly thereof. The self-assembling substrate 3 could itself further comprise one or more stages of dies 2, and in particular transistors, the method 100 according to the invention makes it possible to produce one or more additional stages of microelectronic components without affecting the integrity of the microelectronic components of the underlying stages, in particular due to the fact that the method 100 according to the invention potentially involves no thermal treatment at a high temperature and/or no immersion in potentially damaging environments.

Figure 7:
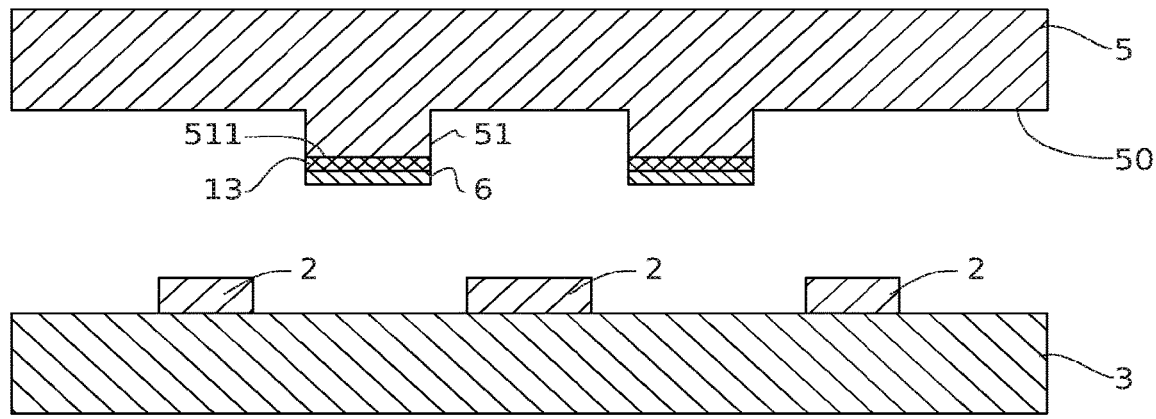
FIGS. 7 and 8 are schematic representations of different steps of a method according to an embodiment of the invention.
Figure 8:
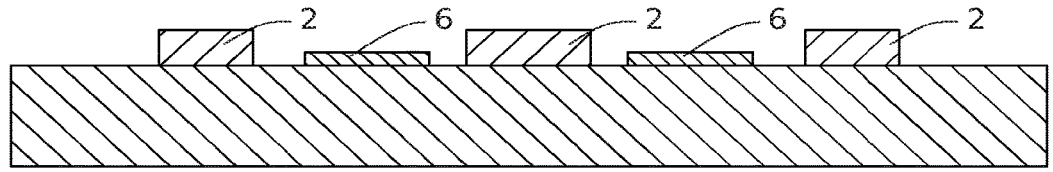

In view of FIGS. 7 and 8, it appears that the method 100 according to the invention makes it possible to achieve a heterogenous hybridisation, not only in terms of stacks and functionalities of dies 2 as has already been discussed above, but also in terms of varied sizes and placements of integrating the dies 2 on the self-assembling substrate 3.

Indeed, in reference to FIGS. 7 and 8, the method 100 according to the invention can further comprise a certain repetition of steps which could lead to this type of complex integration. More specifically, the method 100 according to the invention can further comprise, after having obtained 105 the self-assembly of a first plurality of dies 2 on the self-assembling substrate 3, at least the following steps:

Providing a second self-aligning substrate 5 comprising a plurality of protrusions 51 having an upper face 511 provided with an at least hydrophobic coating 13, Providing a second plurality of dies 6, Obtaining 104, by capillary effect, and typically according to a "die-to-wafer"-type approach, the self-alignment of each die 6 of the second plurality of dies 6 on a corresponding protrusion 51 of the second self-aligning substrate 5, then Obtaining 105, by direct adhesion, and typically according to a "wafer-to-wafer"-type approach, the assembly of the second plurality of dies 6 on the self-assembling substrate 3.

Each protrusion 51 has, if necessary, a thickness greater than the thickness of each protrusion 11 structuring the front face 10 of the self-aligning substrate 1 provided 101 beforehand. This makes it possible to adhere the dies 6 of the second plurality into a placement of the self-assembling substrate 3 different from the placement of the dies 2 of the first plurality, without contacting the dies 2 already assembled on the self-assembling substrate 3.

The dies 6 of the second plurality potentially have a significant different thickness from the thickness of the dies 2 of the first plurality. Due to it being preferable that the front faces of the self-aligned dies 2, 6 are substantially comprised in one same plane, so as to make it possible for a substantially flat face 30 of the self-assembling substrate 3 to come into contact with the front faces of the self-aligned dies 2, 6 totally and simultaneously, it is understood that the integration of the dies 2, 6 having thicknesses which are significantly different from one another via the use of one same self-aligning substrate indices the necessity to form, on this self-aligning substrate, protrusions of different thicknesses specific to absorbing the differences in thickness between dies 2, 6, which would complicate the supply 101 of the self-aligning substrate. The method according to the latter particularity therefore makes it possible to simplify the assembly of the dies 2, 6 of thicknesses which are significantly different to one another, by providing the supply of a plurality of self-aligning substrates of which each substrate is specific to a class of dies of thicknesses which are substantially identical to one another and/or to a position for integrating dies.

Figure 6:
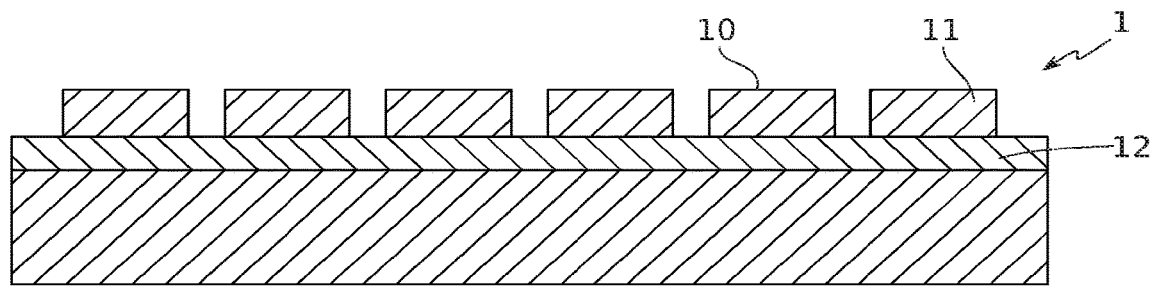
FIG. 6 is a schematic representation of a self-aligning substrate according to an embodiment of the invention.

Whatever the method used to form the protrusions 11, it can be preferable, even necessary, at least when several dies 2 are of thicknesses which are substantially different from one another, that the supply 101 of the self-aligning substrate 1 further comprises at least the following step: depositing a compressible polymer-based layer 12, for example a polydimethylsiloxane (or PDMS) layer, under the protrusions 11. A self-aligning substrate 1 according to this first variant is illustrated in FIG. 6. The layer 12 advantageously makes it possible to absorb, by compression, the slight differences in thickness between dies 2, in particular to obtain 105 the self-assembly of the dies 2 on a self-aligning substrate 3 having a substantially flat face 30. It is thus possible, despite the fact that several dies 2 are of thicknesses which are substantially different from one another, to effectively implement the method 100 according to the invention by forming, on one same self-aligning substrate, protrusions all having the same thickness; such protrusions being easier to form. However, as introduced above, protrusions of different sizing in thickness and/or transversally can also be formed in particular to adapt the dimensions in thickness and/or transversal of the dies intended to be self-aligned there. An adaptation of the dimensions of the dies 2 and of the protrusions 11 according to this second variant represents an additional cost which can be counterbalanced by the potential reuse of the self-aligning substrate to make it possible for the self-alignment of other pluralities of dies 2 and the transfer thereof on possible other self-assembling substrates.

Whatever the variant selected, this selection being potentially connected to the dies 2 (to the nature thereof, the dimensions thereof, or the function thereof) and therefore to the microelectronic components, to self-assemble 100, the method in particular aims to make it possible for the dies 2, once self-aligned on the self-aligning substrate 1, to have hydrophilic front faces 22 which substantially fall into one same plane. In this manner, it will be possible to transfer 1051 simultaneously, through the front faces 22 thereof, all the dies 2 self-aligned on an advantageously flat face 30 of the self-assembling substrate 3, as represented in FIGS. 3 and 7.

The method according to the invention advantageously disconnects the alignment and the assembly of the dies 2, 6. The alignment is achieved during a prior step according to a "die-to-wafer"-type approach, and the assembly is achieved during a subsequent step according to a "wafer-to-wafer"-type approach. A high qualitative yield is thus potentially obtained, since the dies 2, 6 can be individually tested prior to the self-alignment thereof.

With respect to the capillary effect self-assembly method described in patent document FR 2 988 517 A1, the method makes it possible for the self-assembly of dies on a substrate not necessarily having protrusions on the final assembly substrate, and thus overcomes the problem connected to the integration of protrusions on such substrates. However, the method enables the obtaining of the self-alignment of the dies 2, 6 on a substrate by capillary effect. The method according to the invention thus makes it possible to obtain the simultaneous assembly of numerous dies 2, 6 on a substrate, if necessary functionalised, and enables the use of a specific and promising self-aligning method in view of an industrialisation of the methods for producing three-dimensional integrated circuits.

With respect to the disclosure of document US 2012/021563, the main technical advantage achieved here is to be able to obtain a better alignment between the die and the substrate, while making it possible for a subsequent easy disassembly. It is proposed here to ensure that the direct adhesion energy between each die and the self-aligning substrate is less than the direct adhesion energy between each die and the self-assembling substrate, by imposing at least the second face 22 of each die 2 is hydrophilic. This functionalisation of the second face 22 of each die 2 is relatively easier to implement, and this, in a fully controlled manner. It is furthermore also possible, although not necessary, to play on the roughness of the second face 22 of each die 2, to make the direct adhesion energy between each die and the self-assembling substrate vary.

The invention is not limited to the embodiments described above and extends to all embodiments covered by the claims.

For example, the drop 4 can be deposited on each die 2, and more specifically on the first face 20 of each die 2, rather than on each protrusion 11 of the self-aligning substrate 1.

For example, the self-aligning substrate 1 can be an electrostatic "chuck"-type wafer to reinforce the adhesion of the dies 2 self-aligned on the protrusions 11 and to be able to release this adhesion reinforcement to obtain 105 the self-assembly of the dies 2 on the self-assembling substrate 3. Indeed, thanks to this type of wafer, once aligned, the dies 2 can be maintained by a load to the removal, this load can be cancelled and the dies 2 can be released. In the same manner, a vacuum suction chuck can be resorted to. In this case, it will be provided that the self-aligning substrate has, at the level of the protrusions 11, through-vias making it possible to suction the dies 2 on the protrusions 11.

The self-aligning substrate 1 and the self-assembling substrate 3 are described in the examples above as being silicon-based, but other materials can be considered, such as glass, silicon carbide (SiC), gallium arsenide (GaAs), etc.

In reference to FIGS. 9 and 10, two variants of the method 100 according to an embodiment of the invention are discussed below.

According to each of these two variants, the die 2 has, as already mentioned above, a first protruding 23 face 20. Thus, the surface of the second face 22 of the die 2 is substantially greater than the surface of the protrusion 23 of the first face 20 thereof.

Figure 9:
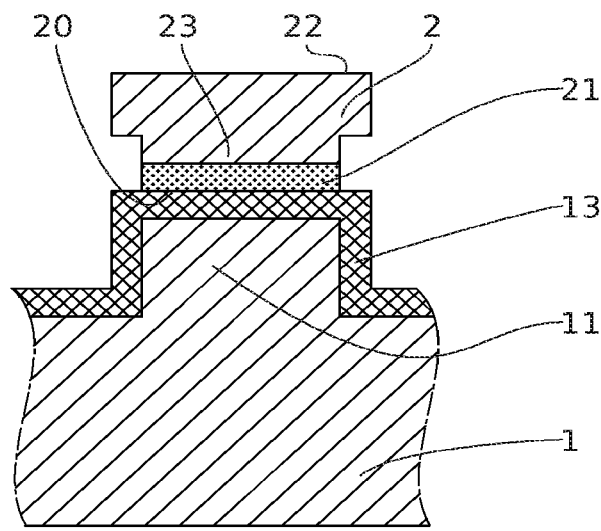
FIGS. 9 and 10 are schematic representations of two variants of the method according to an embodiment of the invention.
Figure 10:
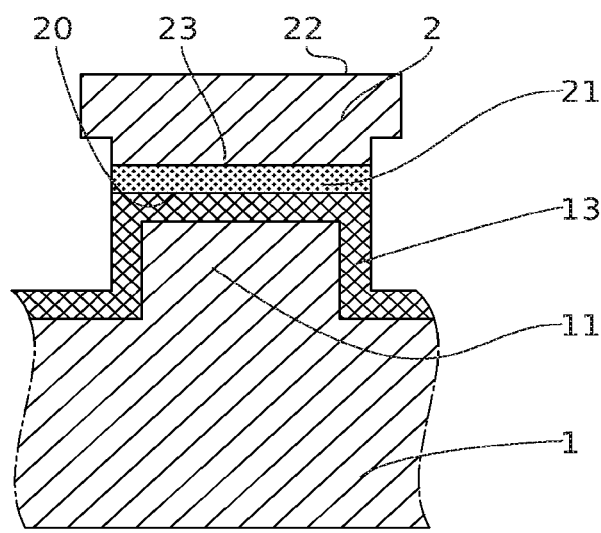

In the example illustrated in FIG. 9, the surface of the protrusion 23 of the first face 20 is substantially less than the surface of the protrusion 11 of the self-aligning substrate 1. In the example illustrated in FIG. 10, the surface of the protrusion 23 of the first face 20 is substantially equal to the surface of the protrusion 11 of the self-aligning substrate 1. However, in the two variants illustrated, it can be considered that the protrusion 23 of the first face 20 and the second face 22 are substantially of the same dimensions as the upper face 111 of the protrusion 11. For example, the surface of the protrusion 23 is of between 60 and 99%, preferably between 85 and 95%, of the surface of the second face 22 of the die 2. Thus, the capillary effect making it possible to obtain 104 the self-alignment of the die 2 on the protrusion 11 can be considered observed whatever the variant adopted from among the variants illustrated in FIGS. 9 and 10. The first protruding 23 face 20 advantageously improves the self-alignment obtained 104.

The invention claimed is:

1. A method for self-assembling microelectronic components comprising:
   providing a self-aligning substrate comprising at least one protrusion each having a thickness greater than 1 μm and each having an upper face and flanks, the upper face and the flanks being hydrophobic,
   providing at least one die, each die having a first face and a second hydrophilic face,
   providing a self-assembling substrate,
   obtaining, by capillary effect, a self-alignment of each die, through the first face thereof, on one single protrusion of the self-aligning substrate by depositing a droplet on the single protrusion, the single protrusion having the thickness greater than 1 μm prior to the depositing of the droplet, then
   obtaining an assembly of the at least one die on the self-assembling substrate, by direct adhesion on the self-assembling substrate of the second hydrophilic face of each die.

2. The method according to claim 1, wherein the self-assembling substrate has a plurality of hydrophilic receiving zones and wherein obtaining the assembly of the at least one die on the self-assembling substrate comprises at least an alignment of the self-aligning substrate and of the self-assembling substrate, such that each die is located opposite a hydrophilic receiving zone of the self-assembling substrate and is transferred by direct adhesion on the hydrophilic receiving zone located opposite.

3. The method according to claim 1, wherein the at least one die has a first protruding face.

4. The method according to claim 1, wherein, the self-aligning substrate comprises a front face structured by said at least one protrusion, and the providing the self-aligning substrate comprises:
   treating the front face of the self-aligning substrate to make (i) at least the upper face and the flanks of said at least one protrusion and (ii) the whole front face of the self-aligning substrate hydrophobic.

5. The method according to claim 4, wherein the treating the front face of the self-aligning substrate comprises at least one from among:
   said at least one protrusion being silicon-based, treating at least the upper face thereof and the flanks thereof with hydrofluoric acid, in an aqueous solution, at a concentration of 1% hydrofluoric acid, or in vapour form,
   depositing a layer of a fluorocarbon polymer, at least on the upper face and the flanks of said at least one protrusion, by exposure to a plasma formed from octafluorobutene, hexafluoroethane, carbon tetrafluoride 20, and/or trifluoromethane,
   depositing a polydimethylsiloxane layer at least on the upper face and the flanks of said at least one protrusion, and
   depositing a SiOC layer at least on the upper face and the flanks of said at least one protrusion, by plasma-assisted chemical vapour deposition by using a gas comprising silicon, a gas containing oxygen, and a gas comprising carbon.

6. The method according to claim 4, wherein, when the self-aligning substrate is silicon-based, and the treating the front face of the self-aligning substrate comprises at least one from among:
   etching the self-aligning substrate by plasma so as to obtain black silicon at least on the upper face and the flanks of said at least one protrusion, and
   depositing a layer of a fluorocarbon polymer, at least on the upper face and the flanks of said at least one protrusion, by exposure to a plasma formed from octafluorobutene, hexafluoroethane, carbon tetrafluoride 20, and/or trifluoromethane.

7. The method according to claim 1, wherein the obtaining the self-alignment of each die on one protrusion of the self-aligning substrate comprises successively:
   depositing the droplet of a liquid comprising water on one from among the upper face of the protrusion and the first face of the respective die, the droplet having a volume of between 0.5 and 2 μL, bringing the respective die onto the protrusion such that the droplet is arranged between the respective die and the protrusion and thus obtaining the self-alignment of the respective die on the protrusion by capillary effect, and
   making the droplet evaporate so as to obtain the direct adhesion of the respective die, through the first face thereof, on the upper face of the protrusion.

8. The method according to claim 7, wherein the obtaining the self-alignment of each die on one protrusion of the self-aligning substrate comprises, when a die is not aligned following the evaporation of the droplet, successively:
   moving the non-aligned die away from the protrusion,
   cleaning at least one from among the upper face of said protrusion from which the non-aligned die has been moved away and the first face of the non-aligned die, and
   bringing the non-aligned die, through the first face thereof, onto said protrusion, so as to obtain the self-alignment and the direct adhesion of the non-aligned die on said protrusion.

9. The method according to claim 1, wherein, several dies are of thicknesses which are substantially different from one another, and the providing the self-aligning substrate comprises:
   depositing a layer of a polydimethylsiloxane layer, under the at least one protrusion, so as to absorb by compression the differences in thickness between the several dies.

10. The method according to claim 1, wherein said at least one protrusion has a thickness greater than Sum.

11. The method according to claim 1, wherein the providing said at least one die comprises treating said at least one die so as to functionalize it.

12. The method according to claim 1, wherein the providing said at least one die further comprises:
preparing the at least one die such that the first face thereof is hydrophobic, and has a contact angle greater than or equal to 20°.

13. The method according to claim 1, wherein the providing the self-aligning substrate and the providing said at least one die are carried out such that the upper face of each protrusion and the die self-aligned on the respective protrusion are of the same dimensions.

14. The method according to claim 1, wherein the providing the self-assembling substrate comprises:
generating a layer of a dielectric material on a portion of a face of the self-assembling substrate, by surface oxidation and/or deposition,
generating a layer of a conductive material on the portion of the face of the self-assembling substrate, and
generating through-vias in a portion of a thickness of the self-assembling substrate.

15. The method according to claim 1, wherein the obtaining the assembly of said at least one die on the self-assembling substrate comprises successively:
transferring the self-assembling substrate on the second hydrophilic face of each die, the transferring being carried out by wafer-to-wafer alignment equipment,
adhering, by direct adhesion, the self-assembling substrate on the second hydrophilic face of each die and annealing the assembly, such that adhesion energy between each die and the self-assembling substrate is greater than adhesion energy between each die and the self-aligning substrate, and
separating the self-aligning and self-assembling substrates from one another so as to remove each die from the self-aligning substrate and obtaining the transfer of each die on the self-assembling substrate.

16. The method according to claim 1, further comprising, after having obtained the assembly of the at least one first die on the self-assembling substrate:
providing a second self-aligning substrate comprising at least one protrusion having a thickness greater than 1 µm and an upper face and hydrophobic flanks, said at least one protrusion of the second self-aligning substrate having a thickness greater than the thickness of said at least one protrusion of the self-aligning substrate,
providing at least one second die having a first face and a second face opposite one another and having a thickness which is significantly different from a thickness of said at least one first die, the second face of said at least one second die being hydrophilic,
obtaining, by capillary effect, a self-alignment of said at least one second die, through the first face thereof, on the at least one protrusion of the second self-aligning substrate, then
obtaining an assembly of said at least one second die on the self-assembling substrate, in a placement of the self-assembling substrate different from the placement of said at least one first die, by direct adhesion on the self-assembling substrate of said at least one second die.

17. The method according to claim 1, wherein the self-aligning substrate and the at least one protrusion are composed of a same material.

* * * * *